US 6,607,395 B2

(12) United States Patent
Hashimoto

(10) Patent No.: US 6,607,395 B2
(45) Date of Patent: Aug. 19, 2003

(54) CARD EDGE CONNECTOR ASSEMBLY WITH ROTATABLE LATCH MEMBERS

(75) Inventor: Shinichi Hashimoto, Kanagawa (JP)

(73) Assignee: Tyco Electronics. AMP, K.K., Kanagawa (JP)

(*) Notice: Subject to any disclaimer, the term of this patent is extended or adjusted under 35 U.S.C. 154(b) by 0 days.

(21) Appl. No.: 09/950,344

(22) Filed: Sep. 11, 2001

(65) Prior Publication Data
US 2002/0031953 A1 Mar. 14, 2002

(30) Foreign Application Priority Data
Sep. 12, 2000 (JP) .......................... 2000-276315

(51) Int. Cl.[7] .................. H01R 13/62; H01R 13/60; H01R 13/66
(52) U.S. Cl. ............................ 439/326; 439/541.5
(58) Field of Search ............... 439/326, 541.5, 439/630, 636, 637, 372, 59, 65

(56) References Cited

U.S. PATENT DOCUMENTS

| 4,917,624 | A | * | 4/1990 | Yu | 439/328 |
| 5,026,297 | A | * | 6/1991 | Krehbiel | 439/326 |
| 5,660,557 | A | * | 8/1997 | Lemke et al. | 439/328 |
| 5,697,802 | A | * | 12/1997 | Kawabe | 439/326 |
| 5,779,494 | A | * | 7/1998 | Ito et al. | 439/326 |
| 5,816,838 | A | * | 10/1998 | Del Prete et al. | 439/326 |
| 5,833,478 | A | * | 11/1998 | Tseng et al. | 439/326 |
| 6,176,725 | B1 | * | 1/2001 | Kobayashi et al. | 439/326 |
| 6,287,134 | B1 | * | 9/2001 | Liao | 439/160 |

FOREIGN PATENT DOCUMENTS

JP 3022230 7/1996 ........... H01R/24/00

OTHER PUBLICATIONS

Patent Abstracts of Japan, Publication No. 08–190967, dated Jul. 23, 1996.

* cited by examiner

Primary Examiner—Lynn D. Feild
Assistant Examiner—Chandrika Prasad

(57) ABSTRACT

The present invention allows easy mounting of the lower daughter board or card in a card edge connector assembly in which two cards are stacked. The sub-assembly (19) is attached via an upper or second pair of latch members (8) to the supporting shafts (22) that protrude from both ends of the housing (6) which is long in the lateral direction. Projecting or supporting parts (82) are caused to protrude outward from both ends of the rear part of the housing (6), so that the sub-assembly (19) is maintained in an open state. The lower or first daughter board (96) is inserted at an inclination into the lower accommodating recess (4) as shown in FIG. 6(A), and is pressed downward as indicated by the arrow (C), so that the first daughter board (96) is attached to the lower or first pair of latch members (10). The second pair of latch members (8) are rotated prior to the insertion of the first daughter board (96), so that the second pair of latch members (8) are withdrawn to the outside of the insertion path of the first daughter board (96). Accordingly, the second pair of latch members (8) do not interfere with the insertion of the first daughter board (96).

16 Claims, 7 Drawing Sheets

CARD EDGE CONNECTOR ASSEMBLY WITH ROTATABLE LATCH MEMBERS

BACKGROUND OF THE INVENTION

The present invention relates to a card edge connector assembly in which daughter boards are mounted, and more specifically, to a card edge connector assembly which has two daughter board accommodating recesses.

DESCRIPTION OF THE PRIOR ART

Electrical connectors used for module boards in which two daughter boards are stacked in horizontal positions, as disclosed in Japanese Patent No. 3022230, are known as card edge connector assemblies of the type accommodating two daughter boards. Such electrical connectors have a housing in which the positions of the card accommodating parts are shifted so that the upper module board or daughter board is accommodated further to the rear than the lower module board. As a result, the positions of the latch members that respectively anchor the upper and lower module boards are shifted so that the latch members that anchor the upper module board are avoided when the lower module board is inserted or pulled out.

In the art described above, although the positions of the upper latch members are shifted when the lower module board is inserted first, the lower module board must be inserted within a narrow space between the upper latch members and the lower latch members. In order to increase the insertion angle of the module boards, tapers are formed on portions of the housing so that the housing does not interfere with the daughter boards. Care must still be taken, however, in order to avoid interference between the lower module board and the upper latch members. Thus, the working characteristics of the insertion and removal of the lower module board are poor.

The present invention provides a card edge connector assembly that allows easy mounting and removal of the daughter board that is inserted first (between two daughter boards).

SUMMARY OF THE INVENTION

One embodiment of the present invention provides a card edge connector assembly equipped with an insulating housing that is attached to a mother board. The housing has two parallel daughter board accommodating recesses that extend parallel to the longitudinal axis. A first and second pair of latch members are disposed parallel to the longitudinal axis near both end parts of the housing in positions corresponding to the daughter board accommodating recesses.

This embodiment is constructed so that when a first daughter board is inserted into the first daughter board accommodating recesses at an inclination with respect to the housing, and is rotated, the daughter board engages with the first or lower pair of latch members. A second daughter board is mounted in the second of the daughter board accommodating recesses. The second or upper pair of latch members used for the second daughter board are attached to the housing so that the second pair of latch members can be rotated in such a manner that the second pair of latch members are withdrawn to the outside of the insertion path of the first daughter board. Accordingly, the second pair of latch members used for the second daughter board do not interfere when the first daughter board is inserted, rotated and mounted in the assembly, or when the first daughter board is removed from the assembly, so that the angle of insertion or removal of the daughter board can be increased.

The term "outside of the insertion path" refers to the area not occupied by the daughter board during the movement of the daughter board in the series of operations extending from the insertion of the daughter board into the housing at an inclination through the rotation and engagement of the daughter board with the latch members. The terms "first daughter board" and "second daughter board" refer respectively to the daughter boards that are first and second in terms of the order of insertion of the daughter boards into the housing of the assembly.

In another embodiment of the present invention, the housing has supporting parts positioned so that when the latch members for the second daughter board are withdrawn, the latch members remain in a withdrawn state. By maintaining the latch members in a withdrawn stage, the mounting or removal of the first daughter board can be easily accomplished, because there is no need to press the latch members used for the second daughter board by hand.

In another embodiment of the present invention, the card edge connector assembly is equipped with an insulating housing that is attached to a mother board. The housing has two parallel daughter board accommodating recesses that extend in the direction of length and a first and second pair of latch members which are disposed in the direction of length near both end parts of the housing in positions corresponding to the daughter board accommodating recesses.

This embodiment is constructed so that when a first daughter board is inserted into the first of the daughter board accommodating recesses at an inclination with respect to the housing, and is rotated, the first daughter board engages with the first pair of latch members. A second daughter board is similarly mounted in the second of the daughter board accommodating recesses where the second pair of latch members used for the second daughter board are connected to each other by a connecting member so that the second pair of latch members are formed into a sub-assembly The sub-assembly is attached to the housing by means of the latch members used for the second daughter board so that the sub-assembly can be withdrawn to the outside of the insertion path of the first daughter board. The sub-assembly can be withdrawn to the outside of the insertion path of the first daughter board so that there is no need for the separate rotation of one pair of latch members, further facilitating the rotating operation.

In another embodiment of the present invention, the connecting member has an overstress-preventing means, which prevents overstress in the latch members used for the second daughter board. The overstress-preventing means prevents the latch members from losing their function as a result of excessive deformation. The overstress-preventing means may also consist of openings that accommodate protruding parts on the latch members of the sub-assembly.

In another embodiment of the present invention, the housing has a supporting part positioned so that when the sub-assembly is withdrawn, the sub-assembly remains in a withdrawn state. When the housing has a supporting part, there is no need to hold the sub-assembly in a withdrawn state by pressing the sub-assembly by hand. Accordingly, the mounting and removal of the first daughter board can be easily accomplished.

DETAILED DESCRIPTION OF THE PREFERRED EMBODIMENT

Figure 1A:
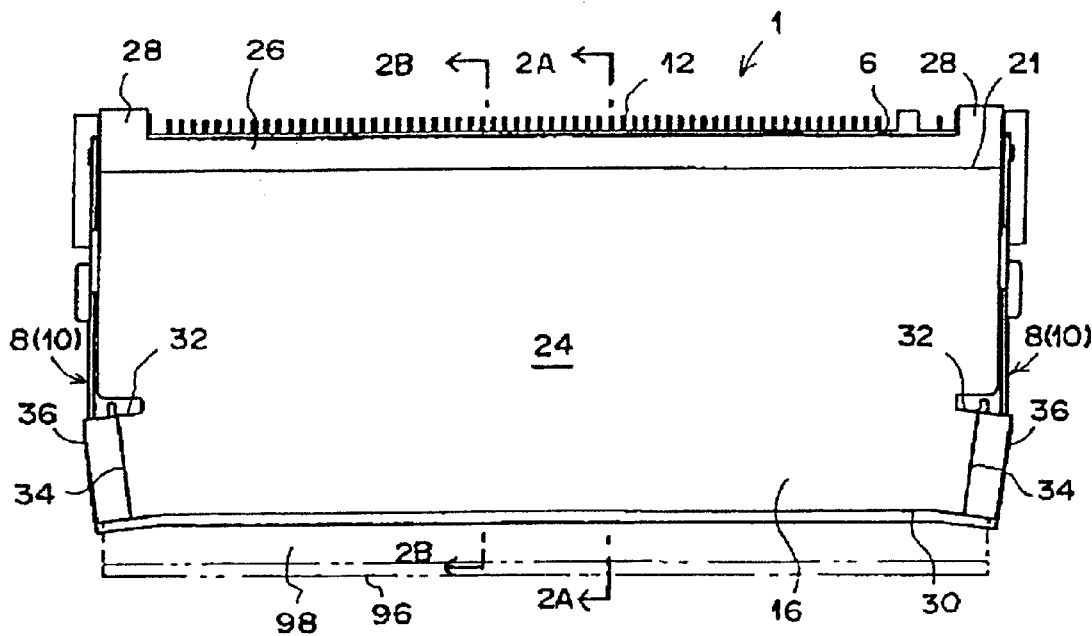
FIG. 1(A) is a plan view of the card edge connector assembly.
Figure 1B:
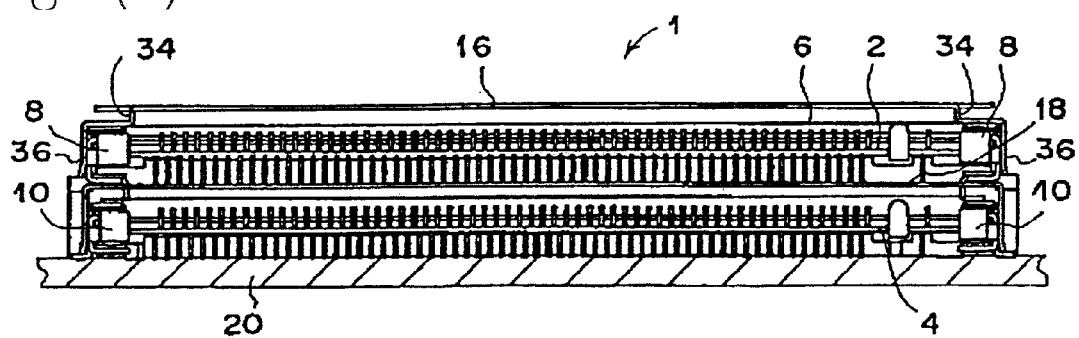
FIG. 1(B) is a front view of the card edge connector assembly.
Figure 1C:
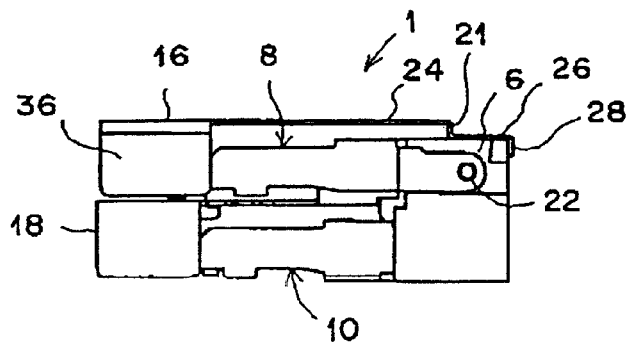
FIG. 1(C) is a side view of the card edge connector assembly.

A preferred embodiment of the card edge connector assembly of the present invention (hereafter referred to as "assembly") is described herein with reference to the attached figures. FIG. 1 shows the assembly 1 of the present invention where the assembly 1 is constructed with two boards stacked in horizontal positions. The assembly 1 has an insulating housing 6 which has an upper or second daughter board accommodating recess 2 and a lower or first daughter board accommodating recess 4, and is attached to a mother board 20 (FIG. 1(B)).

The two parallel accommodating recesses 2 and 4 (FIG. 1(B)) extend parallel to the longitudinal axis of the housing 6. A plurality of contacts 12 (14, 15 (FIG. 2)) are attached to the rear part (i.e., the upper part in FIG. 1(A)) of the housing 6 facing the accommodating recesses 2 and 4. As shown in FIG. 1(A), the lower or first daughter board 96 and the upper or second daughter board 98 are inserted into the accommodating recesses 2 and 4 from the front part of the assembly 1.

Two pairs of latch members 8 and 10 are respectively attached to both end parts of the housing 6 in positions corresponding to the accommodating recesses 2 and 4. The latch members 8 and 10 respectively anchor the inserted daughter boards 98 and 96. The respective pairs of latch members 8 and 10 are arranged so that each pair shows left-right symmetry. The upper latch members 8 are attached so that the latch members can rotate on supporting shafts 22, which protrude from the housing 6 (FIG. 1(C)). Alternatively, the supporting shafts 22 may be separate from the housing 6.

Plates or connecting members 16 and 18 that are substantially rectangular in shape extend to both ends of the housing 6 (FIG. 1(A)). The plates 16 and 18 are attached to the housing 6 in positions corresponding to the latch members 8 and 10. Each of the plates 16 and 18 is formed by stamping from a single metal plate. As shown in FIG. 1(A), the upper plate 16 has a flat main surface 24 and a rear surface 26 that extends in the same direction as the main surface 24 is formed on the rear part of the upper plate 16 with a step part 21 which extends the length of the housing 6 interposed between the main surface 24 and rear surface 26. Attachment parts 28 with a cross-sectional L shape which turn into the rear surface of the housing 6 extend from both end parts of the rear surface.

The cut-outs 32 which extend parallel to the longitudinal axis of the plate 16 are formed near both sides of the front end 30 of the plate 16. Substantially rectangular holding plates 36 that engage with the outsides of the upper latch members 8 are formed by step parts 34 which extend toward the front end 30 of the respective cutouts 32. The holding plates 36 are constrained inward on the side of the front end 30 in conformity to the external shape of the upper latch members 8. The holding plates 36 are used to prevent the latch members 8 from opening outward and disengaging from the daughter board after the second daughter board 98 has been inserted and engaged with the latch members 8. The main surface 24 is positioned relatively high (at the top by the step parts 21 and 34) to ensure space for the ICs (not shown in the figures) that are mounted on the daughter board 98.

Figure 2A:
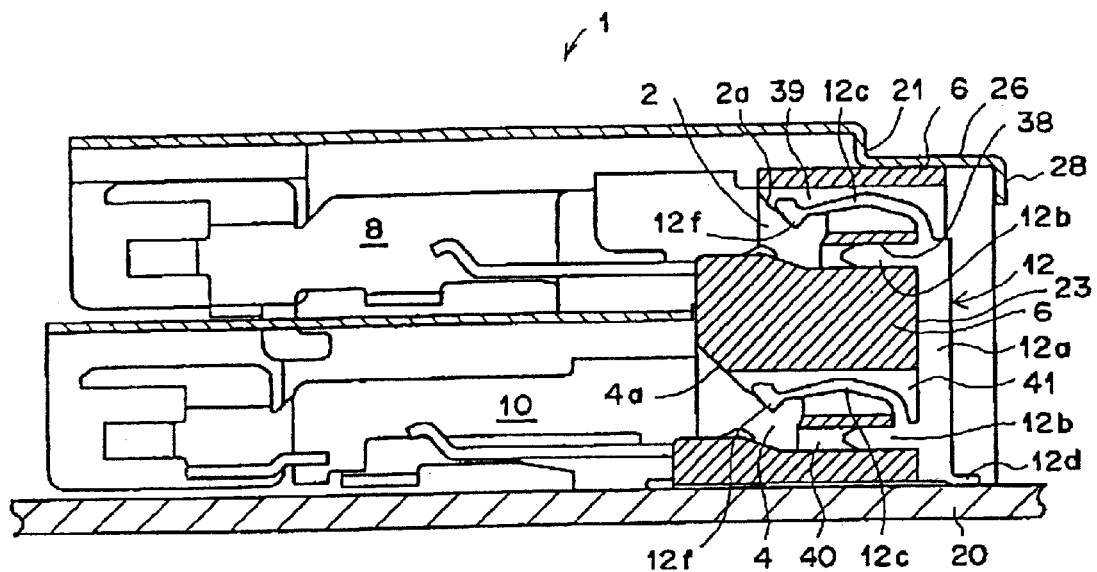
FIG. 2(A) is a sectional view along line 2A—2A in FIG. 1(A)
Figure 2B:
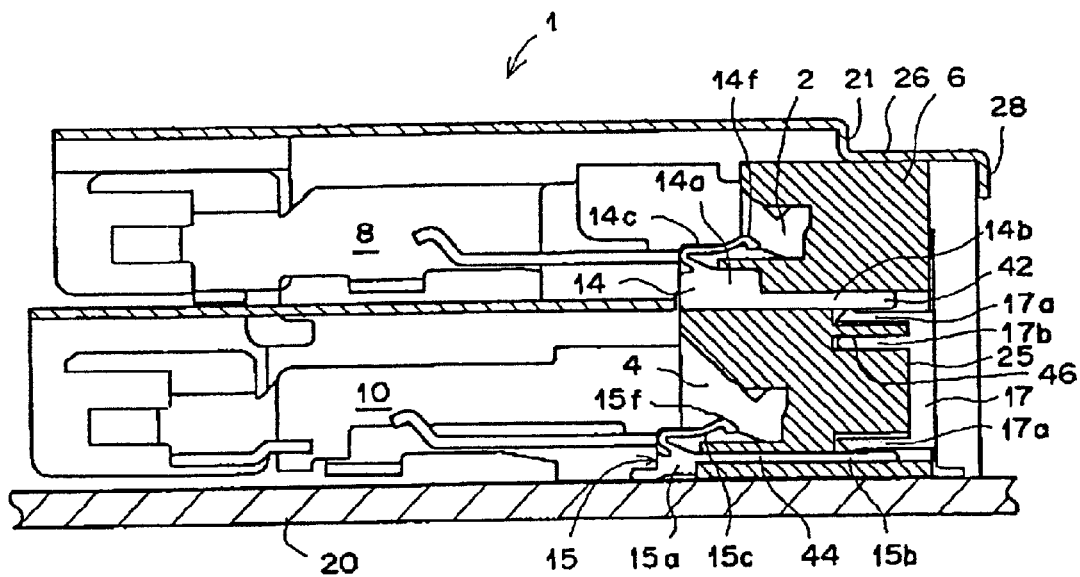
FIG. 2(B) is a sectional view along line 2B—2B in FIG. 1(A)

The cross-sectional shape of the assembly 1 is described with reference to FIG. 2. The housing 6 has upper and lower contact through-holes 38 and 40 used for the attachment of the contacts 12 from the rear of the housing 6 (FIG. 2(A)), and upper and lower through-holes 42 and 44 used for the attachment of the contacts 14 and 15 from the front of the housing 6 (FIG. 2(B)), in positions that are shifted the length of the housing 6. The respective through-holes 38 and 40 communicate with the accommodating recesses 2 and 4, and the through-holes 42 and 44 are adjacent to the accommodating recesses 2 and 4. Contact part passage grooves 39 and 41, which communicate with the accommodating recesses 2 and 4, are formed adjacent to the through-holes 38 and 40.

Each of the contacts 12 have a long, slender main body 12a that extends upward and downward and which is disposed in a contact accommodating groove 23 formed in the housing 6. The attachment tabs 12b are press-fitted in the through-holes 38 and 40 from the main body 12a. Bent contact parts 12c respectively extend into the accommodating recesses 2 and 4 via the contact part passage grooves 39 and 41 from the areas of the attachment tabs 12b. A tine 12d is soldered to a conductive pad (not shown in the figures) on the mother board 20. The tip end portions of the contact parts 12c have contact points 12f which make electrical connections with conductive pads (not shown in the figures) on the daughter boards that are inserted into the accommodating recesses 2 and 4.

It should be noted that the upper wall surfaces 2a and 4a that demarcate the accommodating recesses 2 and 4 are inclined upward at a steep angle, so that the daughter boards can be inserted into the accommodating recesses 2 and 4 at this angle. The lower latch members 10 have press-fitting parts (not shown in the figures) which have barbs on their side edges. The lower latch members 10 are attached to the housing 6 by inserting the press-fitting parts into grooves (not shown in the figures) formed in the housing 6. Accordingly, the lower latch members 10 are fastened to the housing 6 so that the lower latch members 10 cannot rotate upward or downward relative to the housing.

The contacts 14 and 15 have a main body 14a or 15a, and an attachment tab 14b or 15b which extends horizontally from the main body 14a or 15a and is press-fitted in the corresponding through-hole 42 or 44. A contact part 14c or 15c extends into the accommodating recess 2 or 4 while being bent from the main body 14a or 15a. The tip end of the contact part 14c and 15c forms a contact point 14f or 15f that contacts an electrode (not shown in the figures) on the daughter board 96 or 98. A longitudinal groove 25 is formed in the rear part of the housing 6 in a position aligned with the contact 14 or 15. A C-shaped connecting part 17, formed by stamping a metal plate, is disposed in the groove 25. The contact legs 17a are formed on both ends of the connecting part 17. An attachment tab 17b is formed between the contact legs 17a. The attachment tab 17b is fastened by press-fitting in a corresponding groove 46 in the housing 6. The contact legs 17a contact the attachment tabs 14b or 15b of the contacts 14 or 15, so that the contacts 14 and 15 are electrically connected.

Figure 3A:
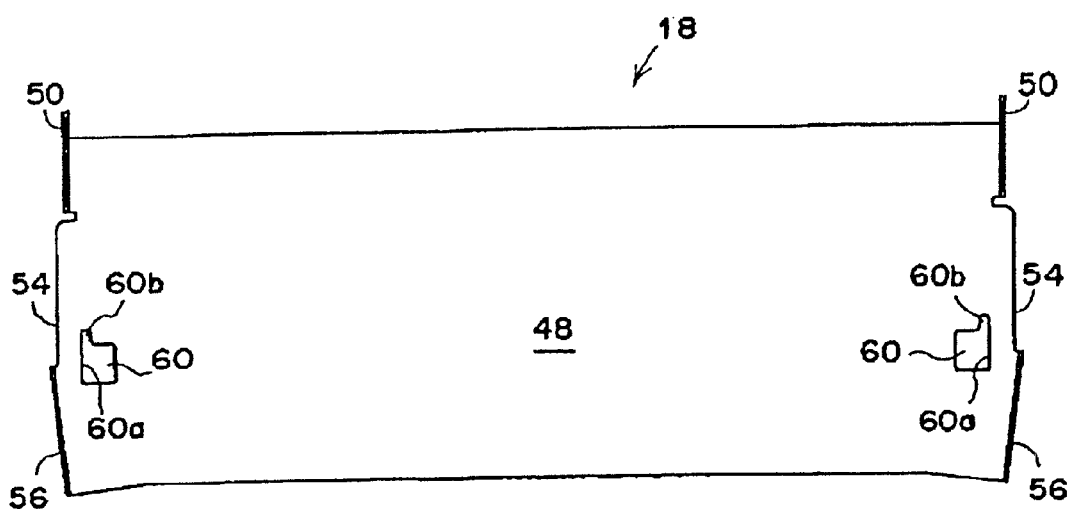
FIG. 3(A) is a plan view of the lower plate.
Figure 3B:
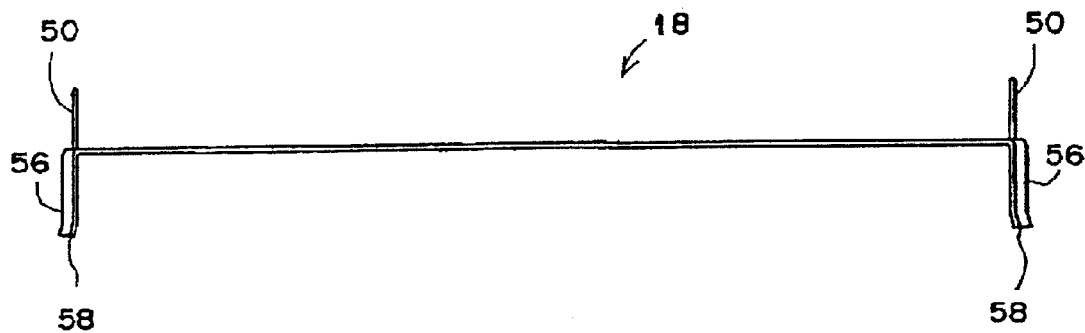
FIG. 3(B) is a front view of the lower plate.
Figure 3C:
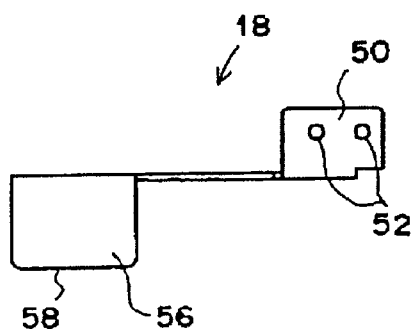
FIG. 3(C) is a side view of the lower plate.

The lower plate 18 is described with reference to FIG. 3. As shown in FIG. 3(A), the lower plate 18 has a substantially rectangular shape similar to that of the plate 16. Rectangular attachment parts 50 which are bent upward relative to the main surface 48 of the plate 18 are formed on both ends of the rear part of the plate 18. Two attachment holes 52, disposed parallel to the main surface 48, are formed in each of the attachment parts 50. The upper latch members 8 are attached to the attachment holes 52.

Rectangular holding plates 56, which are bent downward, are formed on the front parts of both end edges 54 of the plate 18. The holding plates 56 are formed so that the plates are constrained inward in the same manner as the holding plates 36 of the plate 16 that covers the upper latch members 8. The lower ends 58 of the holding plates 56 open slightly outward. Substantially rectangular openings or overstress-preventing means 60 are formed in the main surface 48 near the rear ends of the respective holding plates 56. The outside edges 60a of the respective openings 60 are caused to extend to the rear, and slots 60b are formed in the rear parts of the openings 60. The openings 60 act in conjunction with the upper latch members 8.

The upper latch members 8 will be described with reference to FIG. 4. Each latch member 8 is formed by stamping and bending a single metal plate. Each member 8 has a long, slender flat-plate part (i.e., an arm 62) and a daughter board holding part 64 formed on the front end (i.e., the left end in FIG. 4(A)) of the flat-plate part 62. A hole 65 which is pivot-supported on the supporting shaft 22 of the housing 6 (FIG. 1(C)) is formed in the rear end portion of the flat-plate part 62. The daughter board holding part 64 has a daughter board holding piece 66 which is formed by being bent from the upper edge of the tip end portion of the flat-plate part 62 and a hook-shaped hook part 68 which is caused to protrude by bending the tip end of the flat-plate part 62 inward.

The daughter board holding piece 66 has a taper 66a which is inclined toward the inside or second daughter board 98 and a stopping surface 66b that presses against the daughter board 98. The taper 66a guides the daughter board 98 when the daughter board 98 is inserted and causes the flat-plate part 62 to flex outward, so that the daughter board 98 can be accommodated. When the accommodated daughter board 98 reaches the stopping surface 66b, the flat-plate part 62 elastically recovers, so that the daughter board 98 is restrained by the stopping surface 66b and thus prevented from returning upward. The hook parts 68 of the latch members 8 engage with circular-arc-form cutouts 98a formed in the daughter board 98 (FIG. 7(A)), so that the daughter board 98 is prevented from slipping out in the forward direction (i.e., toward the left in FIG. 4(B)).

Figure 4A:
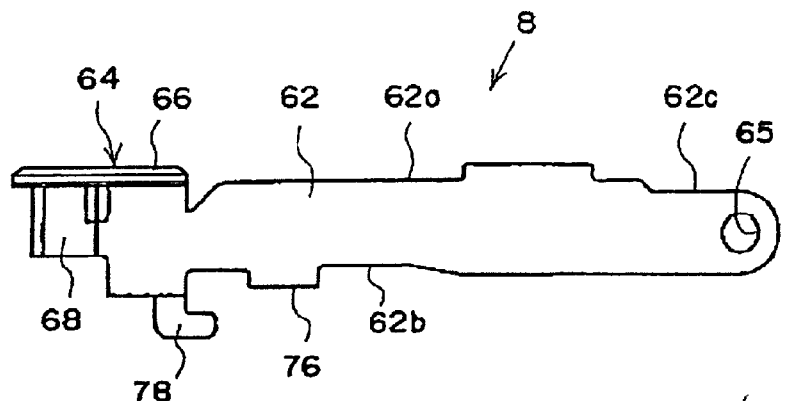
FIG. 4(A) is a first side view of an upper latch member.
Figure 4B:
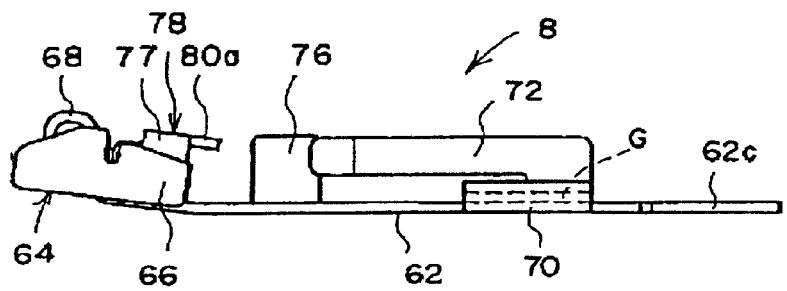
FIG. 4(B) is a plan view of an upper latch member.
Figure 4C:
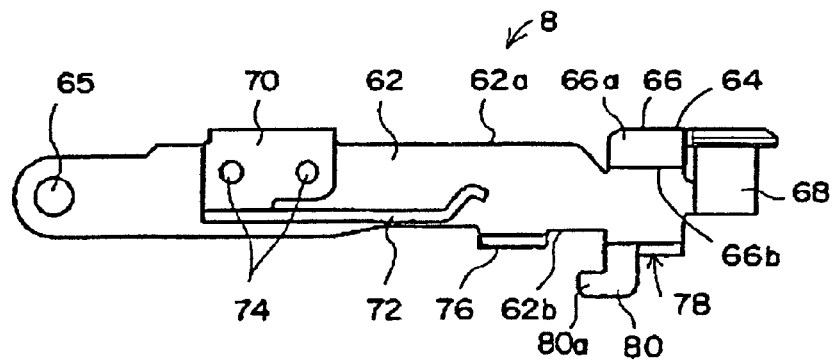
FIG. 4(C) is a second side view of an upper latch member.
Figure 4D:
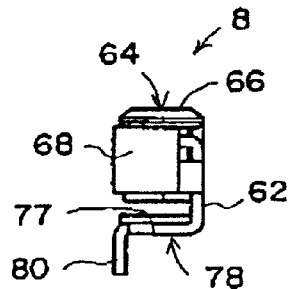
FIG. 4(D) is a front view of an upper latch member.

As shown in FIGS. 4(B) and 4(C), a fastening part 70 which extends upward and is bent parallel to the flat-plate part 62 is formed near the hole 65 on the upper edge 62a of the flat-plate part 62. The bent tip end of the fastening part 70 is bent at a right angle to the flat-plate part 62 to form as an elastic contact part 72 which extends toward the daughter board holding part 64. The tip end portion of the elastic contact part 72 is bent upward, and a ground electrode (not shown in the figures) on the mounted daughter board 98 makes contact with the tip end portion, grounding the daughter board 98. A space G which accommodates the attachment part 50 of the plate 18 is formed between the fastening part 70 and the flat-plate part 62 (FIG. 4(B)). Projections 74, which protrude toward the flat-plate part 62, are formed on the fastening part 70 in positions corresponding to the attachment holes 52 of the plate 18.

An overstress-preventing part 76 is formed on the lower edge 62b of the flat-plate part 62 in a position corresponding to the tip end portion of the elastic contact part 72 to prevent excessive deformation of the elastic contact part 72. An extension part 77 that extends at a right angle to the flat-plate part 62, and a regulating part 78 having an L-shaped part 80 that extends further downward from the extension part 77, are formed on the lower edge 62b of the flat-plate part 62 on the opposite side from the daughter board holding part 64. The L-shaped part 80 has a protruding part 80a that extends rearward parallel to the flat-plate part 62.

Figure 5A:
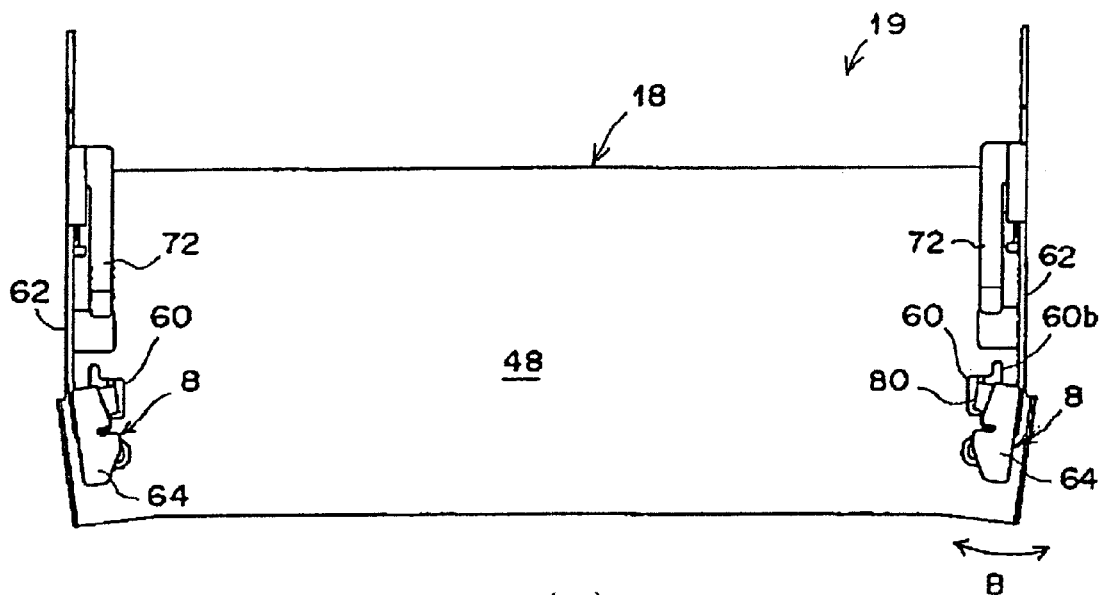
FIG. 5(A) is a plan view of the sub-assembly in which the upper latch members are attached to the plate.
Figure 5B:
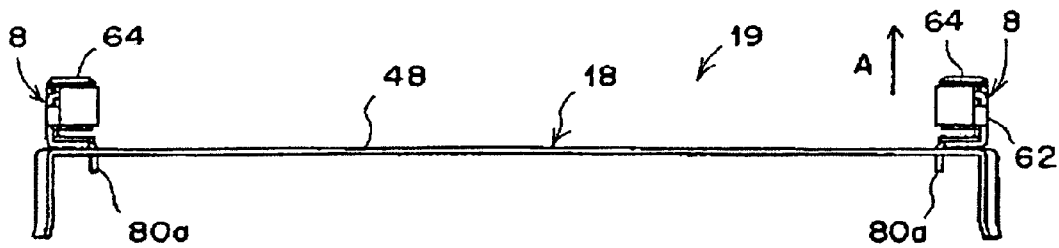
FIG. 5(B) is a front view of the sub-assembly in which the upper latch members are attached to the plate.
Figure 5C:
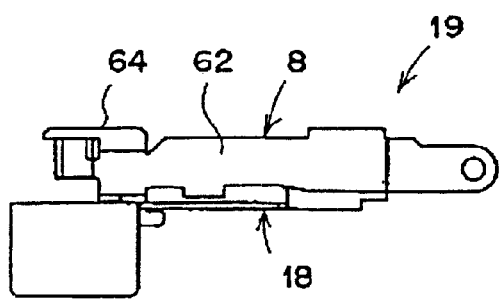
FIG. 5(C) is a side view of the sub-assembly in which the upper latch members are attached to the plate.

The sub-assembly, in which the upper latch members 8 are attached to the lower plate 18, is described with reference to FIG. 5. The fastening parts 70 of the respective upper latch members 8 are attached to the attachment parts 50 of the plate 18 so that the elastic contact parts 72 are on the inside. The two projections 74 on the fastening part 70 of each upper latch member 8 (FIG. 4(C)) are engaged and fastened in the two attachment holes 52 of the plate 18 (FIG. 3(C)). The L-shaped parts 80 of the upper latch members 8 enter the openings 60 in the plate 18. When the L-shape parts 80 enter the openings 60, the protruding parts 80a of the L-shaped parts 80 pass through the slots 60b of the openings 60, so that the protruding parts 80a are disposed on the underside of the main surface 48 of the plate 18.

In cases where no external force is applied to the daughter board holding parts 64, the protruding parts 80a are positioned in the portions of the openings 60 that are removed from the slots 60b. Specifically, the protruding parts 80a are positioned as shown in FIG. 5(A). Accordingly, even in cases where a force A that is directed upward (FIG. 5(B)) is applied to the upper latch members 8, the protruding parts 80a contact the main surface 48 of the plate 18 from below, so that additional movement is restricted and the upper latch members 8 are prevented from leaving the plate 18. When the flat-plate parts 62 accommodate the daughter board 98, the latch members 8 can move within the range in which the L-shaped parts 80 can move as indicated by the arrow B inside the openings 60 (FIG. 5(A)). In this way, the upper latch members 8 and plate 18 are assembled into an integral unit creating a plate sub-assembly 19. Because the openings 60 and protruding parts 80a act in conjunction, overstress of the latch members 8 is prevented.

Figure 6A:
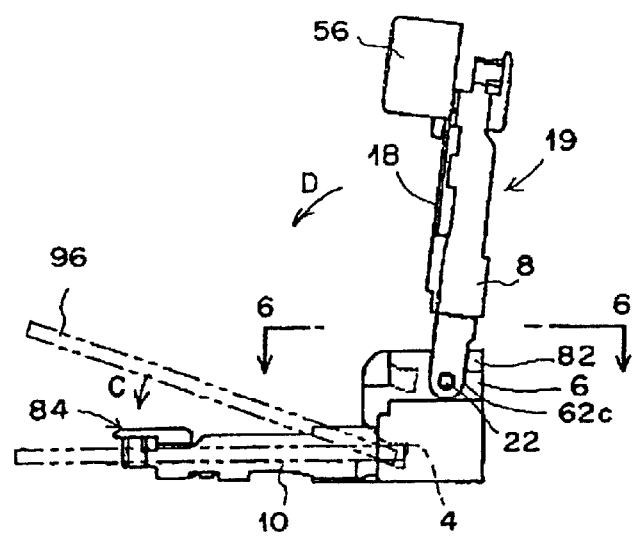
FIG. 6(A) is a side view of the assembly which shows a state in which the sub-assembly has been opened by being rotated about the supporting shafts of the housing for attachment of the lower daughter board.

The method of attachment of the daughter boards 96 and 98 are described with reference to FIGS. 6 and 7. As shown in FIG. 6, the sub-assembly 19 is attached via the upper latch members 8 to the supporting shafts 22 that protrude from both ends of the housing 6 (whose length is in the lateral direction). Projecting or supporting parts 82 are caused to protrude outward on both ends of the rear part of the housing 6. The projecting parts 82 are contacted by the upper edges 62c near the rear parts of the flat-plate parts 62 of the upper latch members 8 when the sub-assembly 19 is opened to mount the daughter board 96, so that the sub-assembly 19 is maintained in an open or withdrawn state. In this state, the lower daughter board 96 is inserted at an inclination into the lower accommodating recess 4 as shown in FIG. 6(A), and is pressed downward or rotated as indicated by the arrow C, so that the daughter board 96 is attached to the lower latch members 10. Thus, in the case of the lower daughter board 96, because the upper latch members 8 are rotated beforehand and withdrawn to the outside of the insertion path of the lower daughter board 96, prior to the insertion of the lower daughter board 96, the upper latch members 8 do not interfere with the insertion of the lower daughter board 96.

Figure 6B:
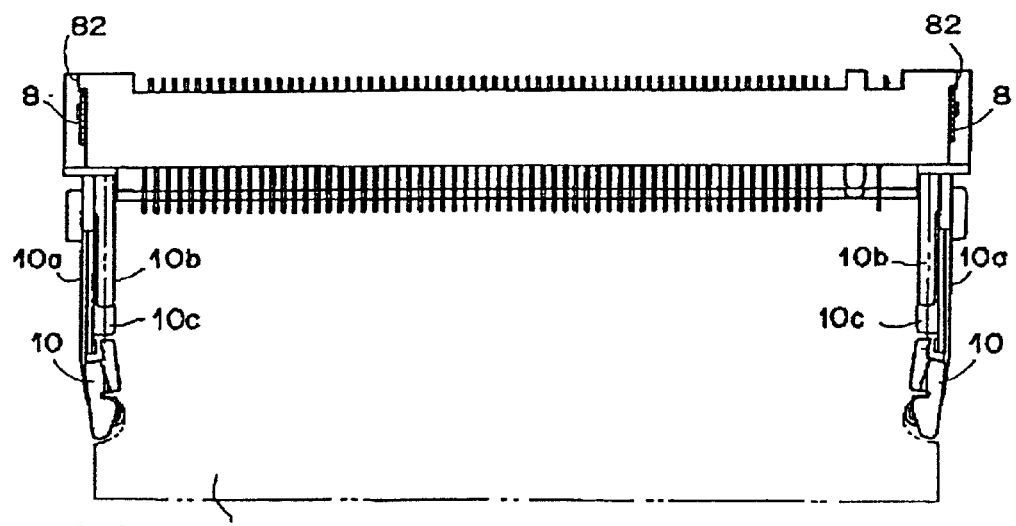
FIG. 6(B) is a sectional plan view along line 6—6 in FIG. 6(A)
Figure 6C:
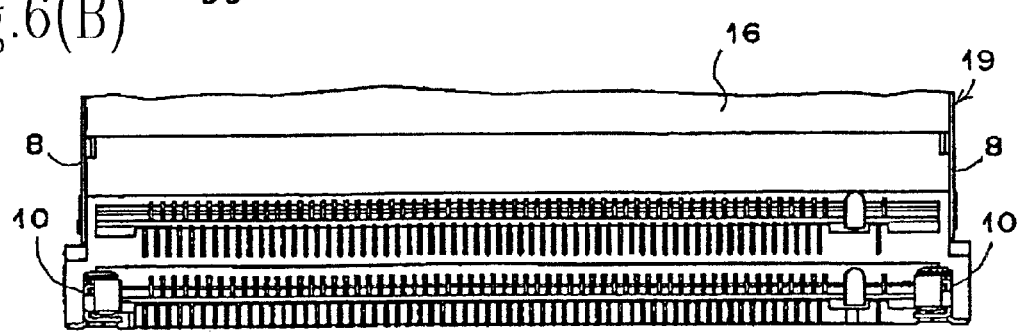
FIG. 6(C) is a front view which shows a state in which the sub-assembly has been opened by being rotated about the supporting shafts of the housing for attachment of the lower daughter board.

The state in which the daughter board 96 is attached to the lower latch members 10 is indicated by an imaginary line in FIG. 6(B). After the lower daughter board 96 has been attached, the sub-assembly 19 is rotated onto the lower board 96 as indicated by the arrow D in FIG. 6(A), resulting in the state shown in FIG. 7. In this case, the holding plates 56 of the plate 18 are positioned to the outside of the daughter board holding parts 84 of the lower latch members 10, so that the daughter board 96 is prevented from slipping out due to the flexing of the daughter board holding parts 84 of the lower latch members 10 to the outside. Since the lower edges 58 of the holding plates 56 open slightly, these edges serve as guides that effect mutual positioning at the time of engagement with the daughter board holding parts 84.

The lower latch members 10 have a shape similar to that of the upper latch members 8. The flat-plate parts 10a of the lower latch members 10 are folded back at the upper edge of the rear part, so that elastic contact parts 10b that make grounding contact with the daughter board 96 are formed in the same manner as the upper latch members 8. Overstress-preventing parts 10c (similar to those of the latch members 8) which prevent overstress of the elastic contact parts 10b are caused to protrude from the lower edges of the flat-plate parts 10a.

Figure 7A:
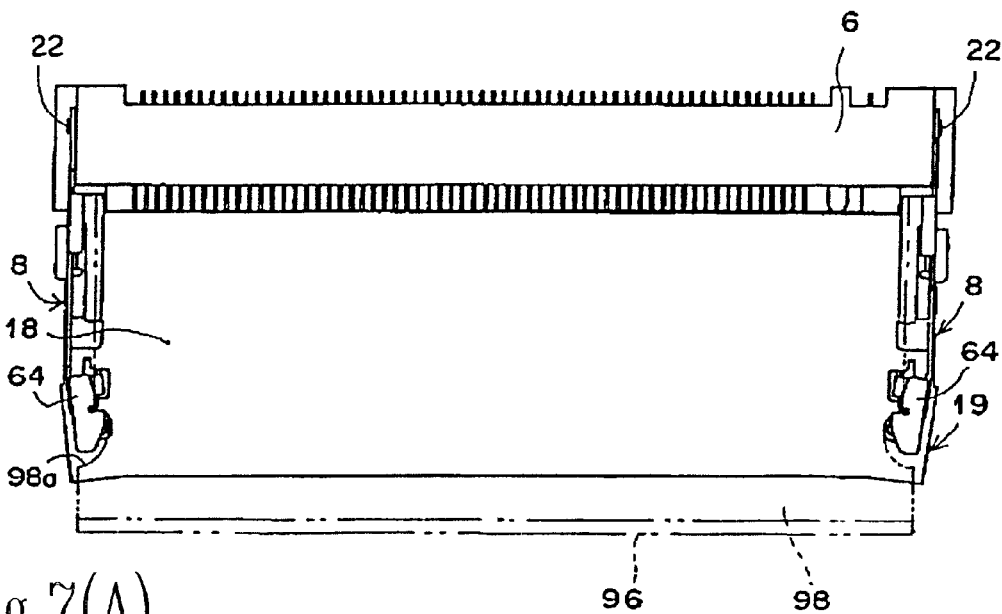
FIG. 7(A) is a plan view which shows the sub-assembly in a closed state following the attachment of the lower daughter board.
Figure 7B:
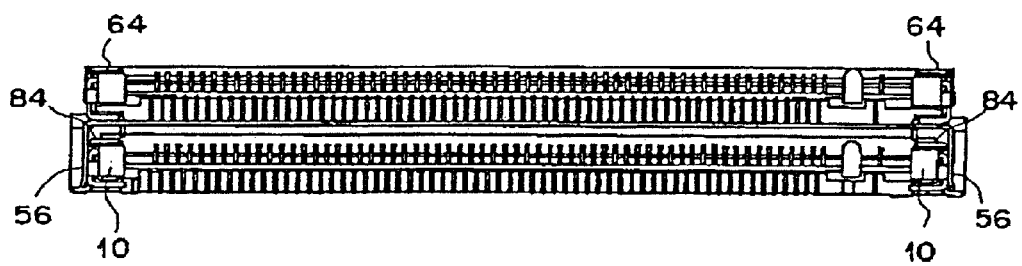
FIG. 7(B) is a front v 0iew which shows the sub-assembly in a closed state following the attachment of the lower daughter board.
Figure 7C:
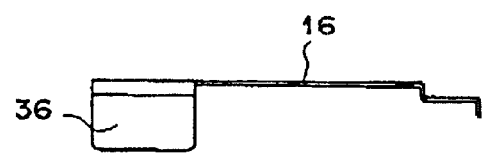
FIG. 7(C) shows a side view of the sub-assembly in a closed state together with the upper plate following the attachment of the lower daughter board.
Figure 7C:
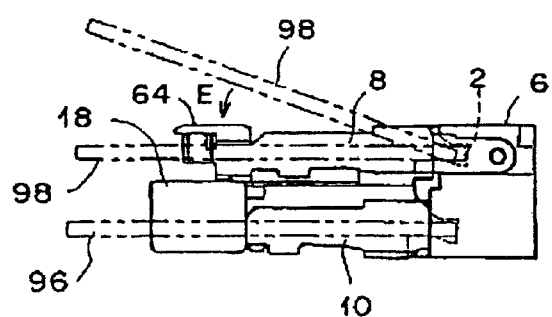

As shown in FIG. 7(A), the sub-assembly 19 covers the lower latch members 10 so that the lower latch members 10 cannot be seen from above. In FIG. 7(B), the holding plates 56 restrict the movement of the lower latch members 10 to the outside. The upper daughter board 98 is inserted into the upper accommodating recess 2 at an inclination as shown in FIG. 7(C), and is attached to the upper latch members 8 by being rotated in the direction indicated by the arrow E (FIG. 7(A)). After the daughter board 98 has been attached, the upper plate 16 is attached to the housing 6. As shown in FIG. 1(B), the holding plates 36 of the plate 16 are disposed on the outside of the daughter board holding parts 64, so that the flexing of the daughter board holding parts 64 to the outside is restricted.

The present invention was described in detail above with reference to a preferred working embodiment. This embodiment, however, is merely an example. The present invention is not limited to such a working configuration. For example, the assembly 1 is an assembly of the type that is mounted horizontally on the mother board 20. The assembly may also be an assembly of the type that is attached in a vertical position. In such a case, the dimensions in the direction of height are increased, however, such a configuration is advantageous in that the mounting area on the mother board is reduced.

I claim:

1. A card edge connector assembly comprising:

an insulating housing having first and second parallel daughter board accommodating recesses that extend parallel to the longitudinal axis and is attached to a mother board;

a first and second pair of latch members disposed near both end parts of the housing parallel to the longitudinal axis in positions corresponding to the daughter board accommodating recesses, the second pair of latch members rotatably attached to the housing and connected by a connecting member to form a sub-assembly having an overstress-preventing means;

a first and second daughter board; and holding plates that extend from the second pair of latch members, the holding plates are positioned adjacent to the first pair of latch members after the first pair of latch members receive the first daughter board to prevent the first pair of latch members from disengaging from the first daughter board;

whereby the sub-assembly is rotated outside of an insertion path of the first daughter board when the first daughter board is inserted into the first daughter board accommodating recess at an inclination with respect to the housing and is rotated so that the first daughter board is engaged with the first pair of latch members.

2. The card edge connector assembly of claim 1, wherein the housing has a supporting part positioned so that when the sub-assembly is rotated outside of the insertion path of the first daughter board, the sub-assembly remains in a withdrawn state.

3. The card edge connector assembly of claim 2, wherein the supporting part is a projection extending from a surface of the housing.

4. The card edge connector assembly of claim 3, wherein the projection is contacted by the second pair of latch members.

5. The card edge connector assembly of claim 1, wherein the overstress-preventing means consists of openings formed on the connecting member that accommodate protruding parts formed on the second pair of latch members of the sub-assembly.

6. The card edge connector assembly of claim 3, wherein the housing has a supporting part positioned so that when the sub-assembly is rotated outside of the insertion path of the first daughter board, the sub-assembly remains in a withdrawn state.

7. The card edge connector assembly of claim 5, wherein the protruding parts are essentially L-shaped.

8. The card edge connector assembly of claim 7, wherein the openings include slots that receive the protruding parts.

9. A card edge connector assembly, comprising:

a housing having first and second daughter board accommodating recesses;

first latch members fixed to ends of the housing adjacent to the first daughter board accommodating recess; and second latch members rotatably fixed to the ends of the housing adjacent to the second daughter board accommodating recess, the second latch members having a projection that engages an opening in a plate to form a sub-assembly that rotates between an open position for insertion of a first card into the first daughter board accommodating recess and a closed position for insertion of a second card into the second daughter board accommodating recess, the projection and the opening forming an overstress-preventing means.

10. The card edge connector assembly of claim 9, further comprising a supporting part that maintains the sub-assembly in the open position.

11. The card edge connector assembly of claim 10, wherein the supporting part projects from a surface of the housing.

12. The card edge connector assembly of claim 11, wherein the supporting part is contacted by the second latch members.

13. The card edge connector assembly of claim 9, further comprising holding plates that extend from the second latch members, the holding plates are positioned adjacent to the first latch members when the sub-assembly is in the closed position to prevent the first latch members from disengaging from the first card.

14. The card edge connector assembly of claim 9, wherein the sub-assembly covers the first latch members when in the closed position.

15. The card edge connector assembly of claim 9, wherein the projection is essentially L-shaped.

16. The card edge connector assembly of claim 15, wherein the opening includes a slot that receives the projection.

* * * * *